(12) United States Patent
Oki et al.

(10) Patent No.: US 12,429,657 B2
(45) Date of Patent: Sep. 30, 2025

(54) OPTICAL DEVICE AND MANUFACTURING METHOD FOR OPTICAL DEVICE

(71) Applicants: Sumitomo Electric Device Innovations, Inc., Yokohama (JP); Sumitomo Electric Industries, Ltd., Osaka (JP)

(72) Inventors: Kazushige Oki, Yokohama (JP); Kazunobu Kobayashi, Osaka (JP); Hiroshi Hara, Osaka (JP); Eiji Tsumura, Osaka (JP); Masanobu Kawamura, Yokohama (JP); Satoshi Yoshimura, Osaka (JP); Kuniyuki Ishii, Yokohama (JP); Fumihiro Nakajima, Yokahama (JP); Hideaki Kitajima, Yokohama (JP); Hideaki Kamisugi, Yokohama (JP)

(73) Assignees: Sumitomo Electric Device Innovations, Inc., Yokohama (JP); Sumitomo Electric Industries, Ltd., Osaka (JP)

( * ) Notice: Subject to any disclaimer, the term of this patent is extended or adjusted under 35 U.S.C. 154(b) by 285 days.

(21) Appl. No.: 18/009,247

(22) PCT Filed: Jun. 11, 2021

(86) PCT No.: PCT/JP2021/022326
§ 371 (c)(1),
(2) Date: Dec. 8, 2022

(87) PCT Pub. No.: WO2021/251488
PCT Pub. Date: Dec. 16, 2021

(65) Prior Publication Data
US 2023/0221505 A1    Jul. 13, 2023

(30) Foreign Application Priority Data

Jun. 12, 2020  (JP) ................................. 2020-102422

(51) Int. Cl.
*G02B 6/42*    (2006.01)

(52) U.S. Cl.
CPC ......... *G02B 6/4214* (2013.01); *G02B 6/4243* (2013.01); *G02B 6/4257* (2013.01); *G02B 6/426* (2013.01)

(58) Field of Classification Search
CPC .. G02B 6/4214; G02B 6/4243; G02B 6/4257; G02B 6/426; G02B 6/4281;
(Continued)

(56) References Cited

U.S. PATENT DOCUMENTS

2014/0133862 A1    5/2014  Fujimura et al.
2014/0263970 A1    9/2014  Heimbuch et al.
(Continued)

FOREIGN PATENT DOCUMENTS

JP    2005-033037 A    2/2005
JP    2014-095843 A    5/2014
(Continued)

*Primary Examiner* — John Bedtelyon
(74) *Attorney, Agent, or Firm* — McCarter & English, LLP; Michael A. Sartori

(57) ABSTRACT

An optical device according to one embodiment includes: a light-emitting element; first and second lenses optically coupled with the light-emitting element; an optical component provided between the light-emitting element and the second lens, optically coupling each of the light-emitting element and the second lens, and multiplexing input lights; and a base having a lower plate having a plurality of convex mounting surfaces with each of the light-emitting element, the first lens, the second lens, and the optical component being mounted thereon and a side wall with a receptacle being connected thereto.

5 Claims, 13 Drawing Sheets

(58) Field of Classification Search
CPC .. G02B 6/4226; G02B 6/4239; G02B 6/4286; G02B 6/4215; G02B 6/423; G02B 6/4249; H01S 5/022
See application file for complete search history.

(56) References Cited

U.S. PATENT DOCUMENTS

| | | |
|---|---|---|
| 2015/0365175 A1 | 12/2015 | Kawamura et al. |
| 2016/0170145 A1* | 6/2016 | Kawamura ............... G02B 6/32 250/226 |
| 2016/0170146 A1* | 6/2016 | Kurokawa ............. G02B 6/425 385/14 |

FOREIGN PATENT DOCUMENTS

| | | |
|---|---|---|
| JP | 2014-102498 A | 6/2014 |
| WO | 2014/065436 A1 | 5/2014 |
| WO | 2020/004872 A1 | 1/2020 |

\* cited by examiner

OPTICAL DEVICE AND MANUFACTURING METHOD FOR OPTICAL DEVICE

TECHNICAL FIELD

The present disclosure relates to optical devices and methods of manufacturing the optical devices.
This application is based upon and claims the benefit of priority from Japanese Patent Application No. 2020-102422, filed on Jun. 12, 2020, the entire contents of which are incorporated herein by reference.

BACKGROUND ART

Patent Literature 1 describes a semiconductor light emitting module. A semiconductor light emitting module includes a semiconductor light emitting module main portion including a semiconductor light-emitting element and a housing that accommodates the semiconductor light emitting module main portion. The housing is an airtight, hermetic type container, and the optical element is mounted inside the container.

CITATION LIST

Patent Literature

Patent Literature 1: Japanese Unexamined Patent Publication No. 2005-033037

Summary of Invention

An optical device according to one embodiment includes: an optical element; a lens optically coupled with the optical element; an optical component provided between the optical element and the lens, optically coupling each of the optical element and the lens, and multiplexing or demultiplexing input lights; and a base having a lower plate having a plurality of convex mounting surfaces with each of the optical element, the lens, and the optical component being mounted thereon and a side wall with a receptacle being connected thereto.

A manufacturing method for an optical device according to one aspect, wherein the optical device includes: an optical element; a lens optically coupled with the optical element; an optical component provided between the optical element and the lens, optically coupling each of the optical element and the lens, and multiplexing or demultiplexing input lights; and a base having a lower plate having a plurality of convex mounting surfaces with each of the optical element, the lens, and the optical component being mounted thereon and a side wall with a receptacle being connected thereto. In this manufacturing method, grooves having outer walls along an outer shape of the optical component are provided on both sides of the mounting surface of the base in a longitudinal direction corresponding to the mounting surface of the optical component, and the method includes: a process of mounting the optical component on the mounting surface by using the outer walls as alignment markers; and a process of aligning the lens.

DESCRIPTION OF EMBODIMENTS

Figure 1:
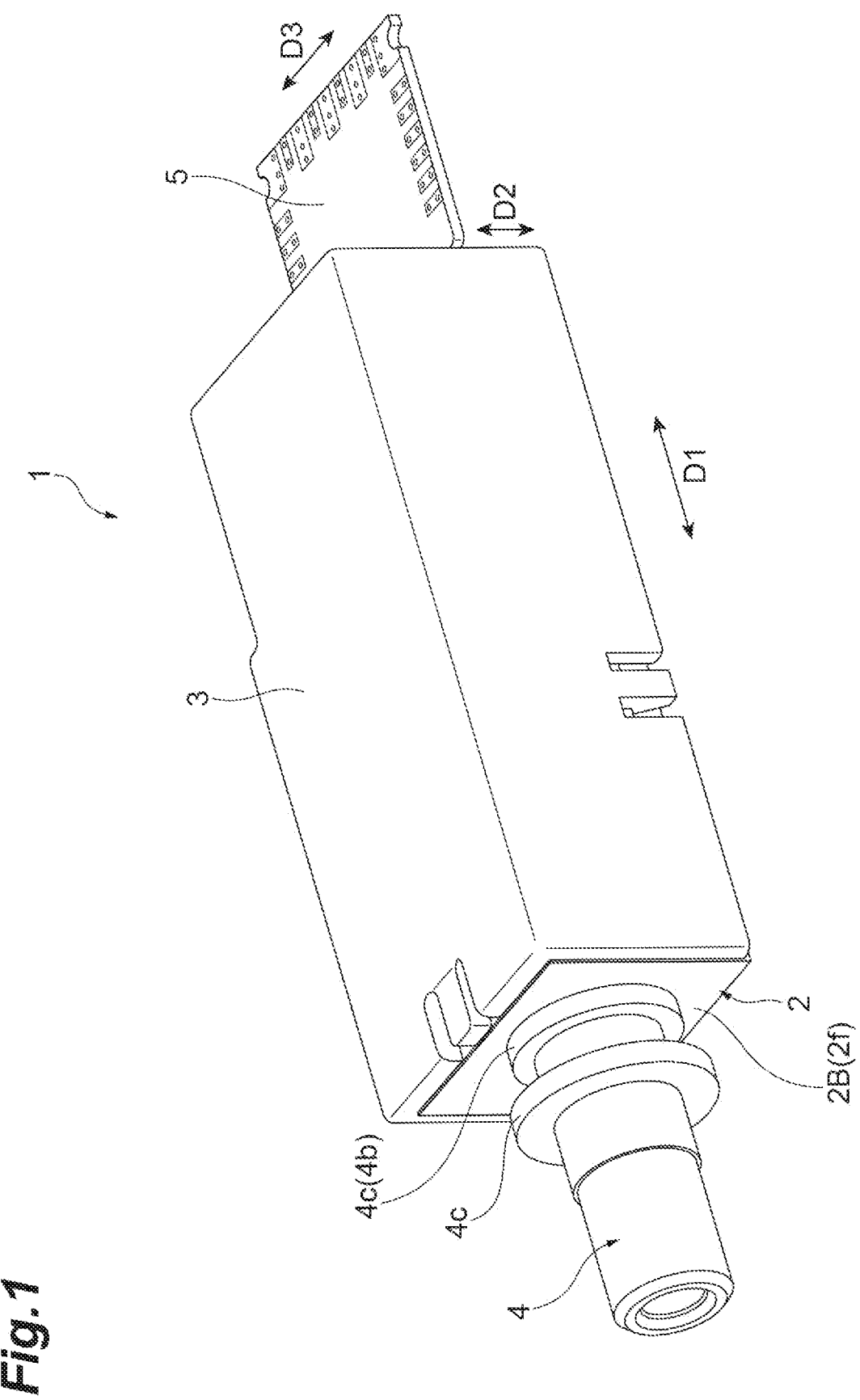
FIG. 1 is a perspective view illustrating an optical device according to an embodiment.

By the way, unlike the above-described hermetic type container, sometimes, due to cost reduction, an optical device provided with a non-hermetic type (non-airtight) container may be used. The optical device includes an LD (Laser Diode), a carrier on which the LD is mounted, an FPC (Flexible Printed Circuit) having pads electrically connected to the LD, and a monitor PD (Photo Diode) for monitoring light from the LD, and a base. The base mounts the carrier, the FPC, and the monitor PD.

The base has an L shape having a side wall to which a receptacle is attached and a lower plate on which the carrier, the FPC, and the monitor PD are mounted. In addition to optical elements such as a monitor PD, optical components such as lenses may be mounted on the lower plate of the base. The optical elements and the optical components are fixed to an upper surface of the lower plate with an adhesive made of a resin. At this time, the adhesive under the optical element and the optical component may rise up during the adhesion or the like, and the adhesive may interfere with the optical path of the optical element and the optical component.

The present disclosure is to provide an optical device, and a manufacturing method for the optical device capable of suppressing interference of an adhesive with an optical path.

According to the present disclosure, interference of an adhesive to an optical path can be suppressed.

Contents of embodiments of the present disclosure are listed and described. An optical device according to one embodiment includes: an optical element; a lens optically coupled with the optical element; an optical component provided between the optical element and the lens, optically coupling each of the optical element and the lens, and multiplexing or demultiplexing input lights; and a base having a lower plate having a plurality of convex mounting surfaces with each of the optical element, the lens, and the optical component being mounted thereon and a side wall with a receptacle being connected thereto.

In this optical device, the base has the lower plate and the side wall, and the lower plate has a plurality of mounting surfaces. Each of the optical element, the lens, and the optical component is mounted on each of the plurality of mounting surfaces. In the lower plate of the base, each of the plurality of mounting surfaces has a convex shape. Accordingly, when an adhesive is applied under each of the optical elements, the lenses, and the optical components, and mounting is performed on the convex mounting surface, even if the adhesive protrudes from the convex mounting surface, the protruding adhesive flows downward from the mounting surface. Accordingly, since the adhesive under the optical element, the lens, and the optical component can be prevented from rising up during the adhesion or the like, the interference of the adhesive with the optical paths of the optical element, the lens, and the optical component can be suppressed.

The heights of the plurality of mounting surfaces may be the same. In this case, when the plurality of convex mounting surfaces are formed by polishing, since the heights of the plurality of mounting surfaces are the same, a polishability can be improved. That is, by polishing, the mounting surfaces having the same height can be easily formed, and a dimensional accuracy of the mounting surfaces can be improved.

The optical component may have two faces extending parallel to each other, and the mounting surface of the optical component may have two sides extending parallel to the two faces of the optical component. A distance between the two sides of the mounting surface of the optical component may be smaller than a distance between the two faces of the optical component. In this case, since the two faces of the optical component and the two sides of the mounting surface are arranged parallel to each other, a difference in tilt angle occurring in the optical component can be eliminated.

Grooves may be provided on both sides of the mounting surface of the base in a longitudinal direction corresponding to the mounting surface of the optical component. In this case, even if the amount of adhesive is large, the adhesive can be released to the grooves, so that the interference of the adhesive with the optical path can be more reliably suppressed.

The grooves may have the outer walls along an outer shape of the optical component. In this case, the outer walls of the grooves can be used for passive alignment of the optical component.

There is provided a manufacturing method for an optical device according to one embodiment, wherein the optical device includes: an optical element; a lens optically coupled with the optical element; an optical component provided between the optical element and the lens, optically coupling each of the optical element and the lens, and multiplexing or demultiplexing input lights; and a base having a lower plate having a plurality of convex mounting surfaces with each of the optical element, the lens, and the optical component being mounted thereon and a side wall with a receptacle being connected thereto. In this manufacturing method, grooves having outer walls along an outer shape of the optical component are provided on both sides of the mounting surface of the base in a longitudinal direction corresponding to the mounting surface of the optical component, and the method includes: a process of mounting the optical component on the mounting surface by using the outer walls as alignment markers; and a process of aligning the lens.

In this manufacturing method for the optical device, the optical element, the lens, and the optical component are mounted on the plurality of mounting surfaces, respectively. In the lower plate of the base, each of the plurality of mounting surfaces has a convex shape. Accordingly, when each of the optical elements, the lenses, and the optical components with the adhesive being applied under these components is mounted on the convex mounting surface, even if the adhesive protrudes from the convex mounting surface, the protruding adhesive flows downward from the mounting surface. Accordingly, since the adhesive under the optical element, the lens, and the optical component can be prevented from rising up during the adhesion or the like, the interference of the adhesive with the optical paths of the optical element, the lens, and the optical component can be suppressed. In this manufacturing method, the alignment of the lens can be performed in a state where the component is mounted on the mounting surface by using the outer walls of the grooves as alignment markers. Accordingly, the optical components and the lenses can be arranged on each mounting surface with high accuracy.

Specific examples of the optical device of the present disclosure will be described below with reference to the drawings. It is noted that the present invention is not limited to the following examples, but is indicated by the scope of the claims, and the present invention is intended to include all modifications within the scope of the claims and the equivalent scope of the claims. In the description of the drawings, the same or corresponding elements are denoted by the same reference numerals, and redundant descriptions are omitted as appropriate. The drawings may be partially simplified or exaggerated to facilitate the understanding, and the dimensional ratios are not limited to those described in the drawings.

FIG. 1 is a perspective view illustrating an optical device 1 according to this embodiment. In this embodiment, the optical device 1 which is an optical transmitter is illustrated. As illustrated in FIG. 1, the optical device 1 includes a base 2, a cover 3 covering the base 2, a receptacle 4 having a cylindrical sleeve, and a wiring board 5. The optical device 1 extends along a longitudinal direction D1, and the receptacle 4, cover 3 (base 2), and the wiring board 5 are arranged in this order.

Figure 2:
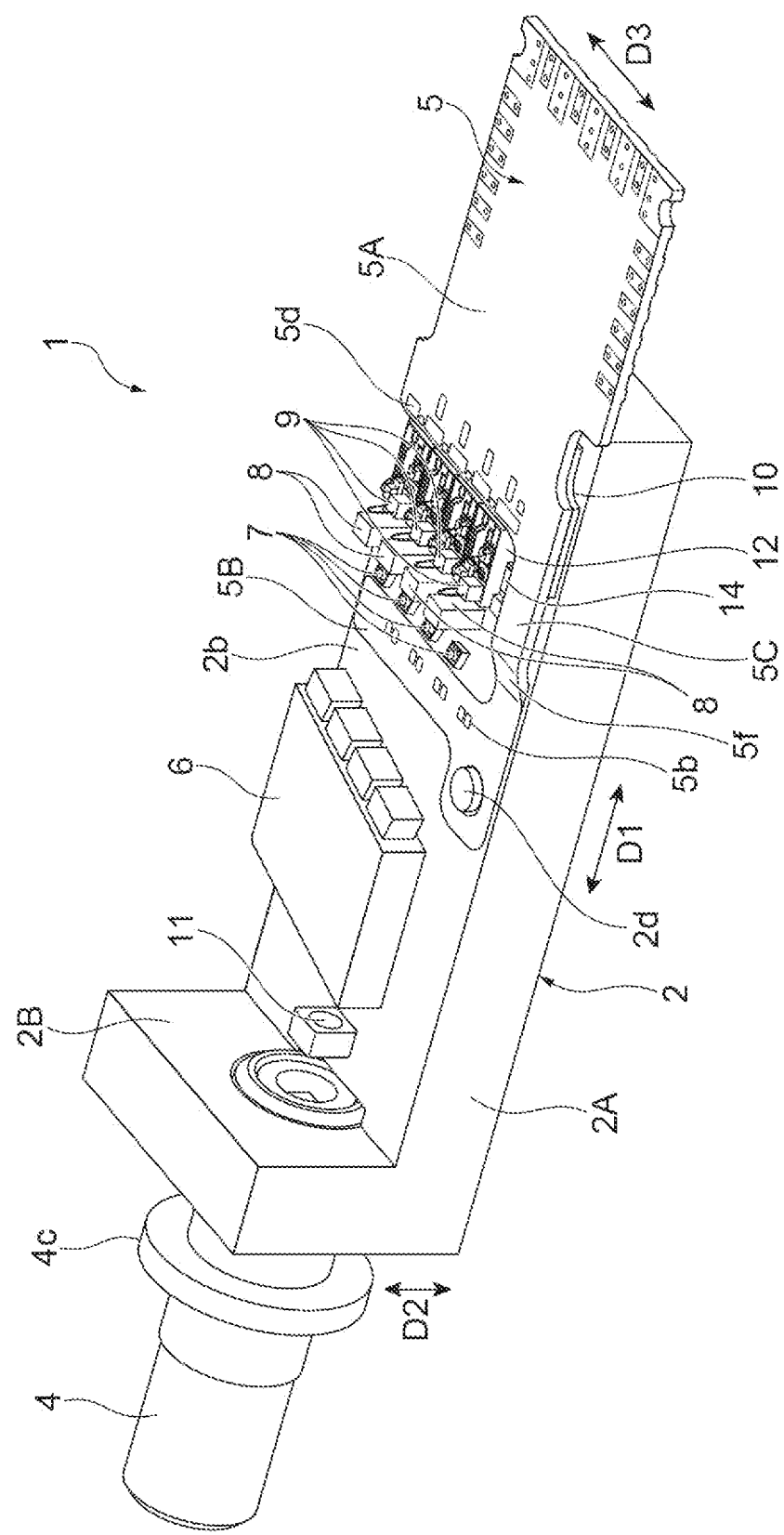
FIG. 2 is a perspective view illustrating a state in which a cover is removed from the optical device of FIG. 1.

FIG. 2 is a perspective view of the optical device 1 from which the cover 3 is removed. As illustrated in FIGS. 1 and 2, the base 2 includes a lower plate 2A extending in the longitudinal direction D1 and a side wall 2B extending in a height direction D2 from one end of the lower plate 2A in the longitudinal direction Dl. The base 2 is made of, for example, a metal. The material of the base 2 is, as an example, Kovar (an alloy in which at least nickel and cobalt are mixed with iron) or SUS (Steel Use Stainless). The base 2 may be configured with iron, chromium, an alloy of iron and chromium, an alloy of iron and nickel, or plastic.

The shape of the base 2 viewed from the width direction D3 of the optical device 1 is an L shape. The base 2 is also referred to as an L-shaped base. A receptacle 4 is connected to the side wall 2B, a hole is formed as an emitting end of an output light L (refer to FIG. 3), and the hole penetrates the side wall 2B in the longitudinal direction D1. The receptacle 4 is cylindrically formed. The receptacle 4 has a plurality of flanges 4c, and one of the plurality of flanges 4c functions as a guide 4b that determines a position of the receptacle 4. In the receptacle 4, in a state of being fixed to the base 2, for example, the guide 4b is in contact with an outer surface 2f of the side wall 2B.

For example, the base 2 has a rectangular shape as viewed from the height direction D2. The base 2 is a component for mounting components accommodated inside the optical device 1, and each component of the optical device 1 is mounted on the lower plate 2A. The lower plate 2A has a long portion protruding from the side wall 2B in the longitudinal direction D1, and each component of the optical device 1 is mounted on the long portion. Each component of the optical device 1 is fixed to the lower plate 2A with an adhesive resin R (refer to FIG. 3). The lower plate 2A has a main surface 2b facing each component inside the optical device 1, a guide pin 2d for determining positions of the cover 3 and the wiring board 5 with respect to the base 2, and an outer surface 2f exposed to the outside of the optical device 1. The main surface 2b has a rectangular shape extending in the longitudinal direction D1 and the width direction D3.

The guide pin 2d protrudes from the main surface 2b in the height direction D2. The guide pin 2d has, for example, a cylindrical shape. The guide pin 2d is provided, for example, on one side in the width direction D3 (a position deviated from the center of the base 2 in the width direction D3). The cover 3 is a component that covers the base 2 in the height direction D2. Each of the components of the optical device 1 is accommodated inside the base 2 and the cover 3.

The optical device 1 includes a wiring board 5, an optical component 6, a light-receiving element 7 (optical element), a first lens 8 (lens), a light-emitting element 9 (optical element), a spacer 10, and a thermistor 14 inside the base 2 and the cover 3. A portion of the wiring board 5 extends from the base 2 and the cover 3 to the opposite side of the receptacle 4. A portion of the wiring board 5 extending to the side opposite to the receptacle 4 protrudes outside the optical device 1. The optical device 1 further includes a second lens 11 interposed between the receptacle 4 and the optical component 6. For example, the optical device 1 includes four light-emitting elements 9, four first lenses 8, four light-receiving elements 7, an optical component 6, and a second lens 11 (lens).

The optical device 1 is a multi-channel light emitting module having four lanes, including four light-receiving elements 7, four first lenses 8, and four light-receiving elements 7. In the optical device 1 having four lanes of optical paths for the output light L, the optical path length of the output light L differs for each channel. The receptacle 4 is arranged, for example, at a position offset from the center of the base 2 in the width direction D3. The optical path of the output light L from the light-emitting element 9 positioned at the end portion (upper end portion in FIG. 2) opposite to the receptacle 4 in the width direction D3 is the longest. The optical path of the output light L from the light-emitting element 9 positioned at the end portion (lower end portion in FIG. 2) of the receptacle 4 side in the width direction D3 is the shortest.

The plurality of light-emitting elements 9 and the plurality of light-receiving elements 7 are mounted on the base 2. The plurality of light-emitting elements 9 are arranged to be aligned along the width direction D3, and the plurality of light-receiving elements 7 are arranged to be aligned along the width direction D3. For example, each of the four light-emitting elements 9 is mounted on the main surface 2b of the base 2 via a carrier 12. Each light-emitting element 9 is provided corresponding to each of the four first lenses 8 and each of the four light-receiving elements 7. Each light-emitting element 9 is, for example, a semiconductor laser diode (LD). The output light L which is a divergent light output from the light-emitting element 9 is converted into a collimated light by each first lens 8. Thus, the first lens 8 is optically coupled with the light-emitting element 9.

The wiring board 5 is, for example, an FPC (Flexible Printed Circuit) mounted on the base 2. The wiring board 5 includes a first region 5A extending outward from the optical device 1, a second region 5B provided with pads 5b, and a connection region 5C connecting the first region 5A and the second region 5B to each other. The first region 5A, the second region 5B, and the connection region 5C have a U shape (C shape) as viewed from the height direction D2.

The first region 5A includes pads 5d electrically connected to the light-emitting elements 9. For example, each of the light-emitting elements 9 is connected to the pads 5d via the wire. The first region 5A is provided at the position higher than the second region 5B (a position away from the main surface 2b of the base 2). For example, the height position of the first region 5A matches the height of the carrier 12 on which the light-emitting element 9 is mounted. Accordingly, the length of the wire extending from each light-emitting element 9 to the pads 5d can be decreased.

For example, one wiring board 5 includes the first region 5A as an upper stage and the second region 5B as a lower stage and is fixed to the base 2 by adhesion. The second region 5B is provided at the position lower than the first region 5A, and is in contact with, for example, the main surface 2b of the base 2. Due to the low position of the second region 5B, the wire extending from the wiring board 5 or the light-receiving element 7 can be prevented from interfering with the output light L passing through the light-emitting element 9 and the first lens 8.

The width (the length in the width direction D3) of the connection region 5C of the wiring board 5 is smaller than the width of the first region 5A and the width of the second region 5B. The connection region 5C is provided in the end portion of the receptacle 4 side in, for example, the width direction D3. The connection region 5C extends from the end portion of the first region 5A in the width direction D3 to the end portion of the second region 5B in the width direction D3. A thickness of the wiring board 5 in the first region 5A and a thickness of the wiring board 5 in the second region 5B are, for example, the same. The connection region 5C extends in the longitudinal direction D1 between the first region 5A and the second region 5B and is located at the end portion of the base 2 in, for example, the width direction D3. The connection region 5C has a step or inclination located between the first region 5A and the second region 5B. This embodiment illustrates the example in which the connection region 5C has an inclination 5f.

The spacer 10 is provided between the first region 5A and the base 2, and for example, the spacer 10 secures the height of the first region 5A. It is noted that, a reinforcing plate made of an insulating material may be provided in the first region 5A of the wiring board 5 instead of the spacer 10. In this case, the wiring pattern can be also provided on the lower surface of the first region 5A.

The output light L output from the light-emitting element 9 via the first lens 8 passes through the light-receiving element 7 and is input to the optical component 6. The optical component 6 is provided between the light-emitting element 9 and the second lens 11 and optically couples the light-emitting element 9 and the second lens 11. The optical component 6 multiplexes the input lights (output lights L) input to the optical component 6. For example, the optical component 6 is an optical multiplexer that multiplexes the four output lights L. The four output lights L are output from the optical component 6 to the second lens 11 as one output light L multiplexed inside the optical component 6. The second lens 11 collects the output light L from the optical component 6, collects the output light L onto the optical fiber held in the receptacle 4, and the output light L passing through the optical fiber held in the receptacle 4 is output to the outside of the optical device 1. The second lens 11 is optically coupled with the light-emitting element 9 via the optical component 6.

The light-receiving element 7 is a monitor PD (Photo Diode) that monitors the output light L from each of the plurality of light-emitting elements 9. The light-receiving element 7 monitors an intensity of the output light L by receiving a portion of the output light L from the light-emitting element 9. For example, each of the four light-receiving elements 7 is mounted on the main surface 2b of the base 2 via a carrier made of a dielectric material. The light-receiving element 7 converts a portion of the output light L from the light-emitting element 9 into an electric signal and outputs the converted electric signal to the pads 5b of the wiring board 5 via a wire (not illustrated). The light-receiving element 7 and the wire extending from the light-receiving element 7 to the pads 5b are provided on a light output side (receptacle 4 side) of the light-emitting element 9. APC control (Auto Power Control) of the output light L from the light-emitting element 9 can be executed by outputting the electric signal from the light-receiving element 7.

The second region 5B is a PD wiring FPC having the pads 5b for wiring to the light-receiving element 7 and is located on the light output side (receptacle 4 side) of the light-receiving element 7. The light-receiving element 7 is a surface incident type light-receiving element. The light-receiving element 7 is arranged such that a light-receiving surface is oblique to, for example, the optical axis of the output light L. By arranging the light-receiving elements 7 such that the light-receiving surface is oblique to the optical axis of the output light L, the light-receiving elements 7 receive a portion of the output light L.

Accordingly, by arranging the light-receiving element 7 on the light output side of the light-emitting element 9, the output light L can be monitored with a simple configuration on the light output side. The wiring such as wires for the light-receiving element 7 which is a monitor PD is provided on the light output side from the light-receiving element 7. Accordingly, electrical connection to the light-receiving element 7 can be allowed to be performed without decreasing a light receiving sensitivity of the light-receiving element 7. Since the light-receiving element 7 is directly wired to, for example, the pads 5b on the wiring board 5, there is no need to mount a separate carrier or the like. Accordingly, the configuration contributes to cost reduction.

Figure 3:
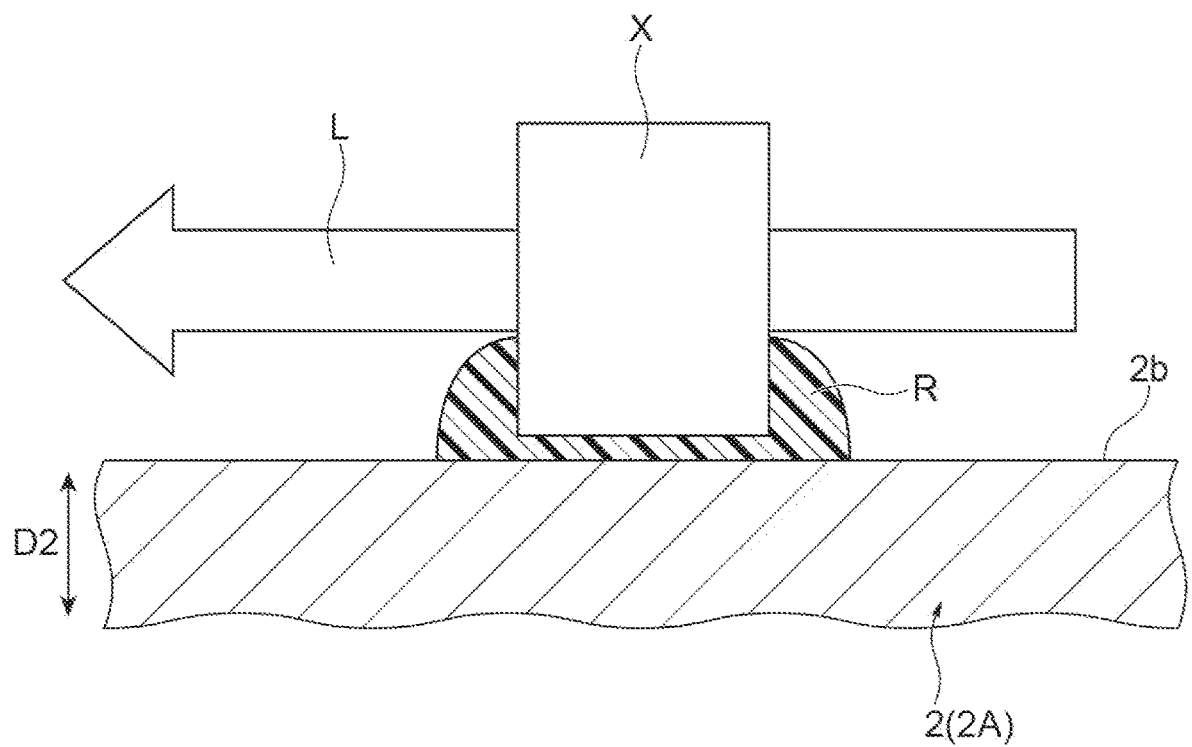
FIG. 3 is a view schematically illustrating a relationship among a base, optical elements, and optical paths of an optical device of a comparative example.

By the way, as illustrated in FIG. 3, when the component mounting surface of the base 2 on which the component X (for example, the optical component such as the optical component 6, the first lens 8, or the second lens 11) inside the optical device 1 are mounted is a flat surface, the adhesive resin R may protrude into the optical path of the output light L. There is a concern that the resin R that adheres the component X in this way interferes with the optical path of the output light L.

Figure 4:
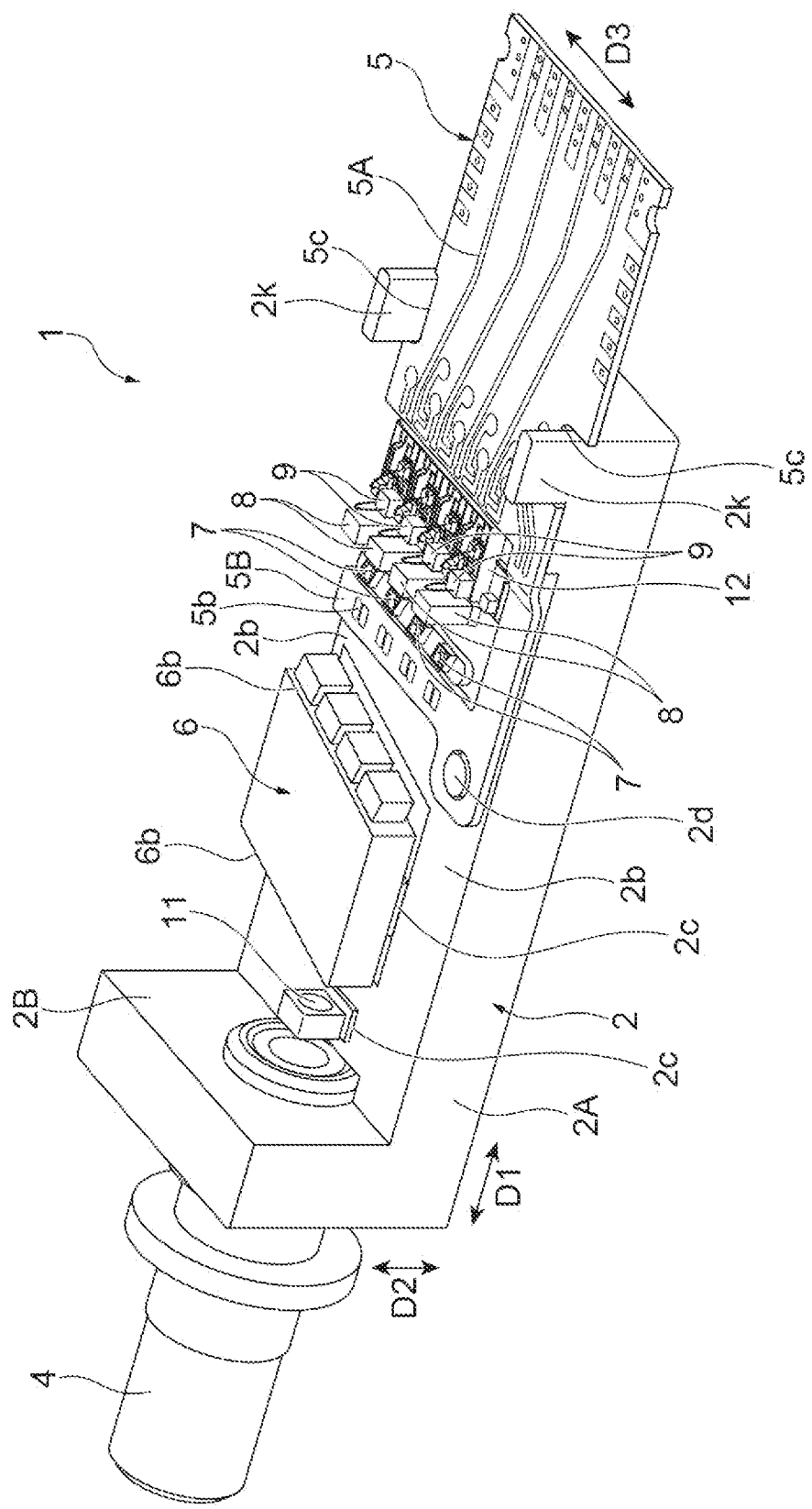
FIG. 4 is a perspective view illustrating lenses, optical components, a wiring board, and optical elements of the optical device of FIG. 1.
Figure 5:
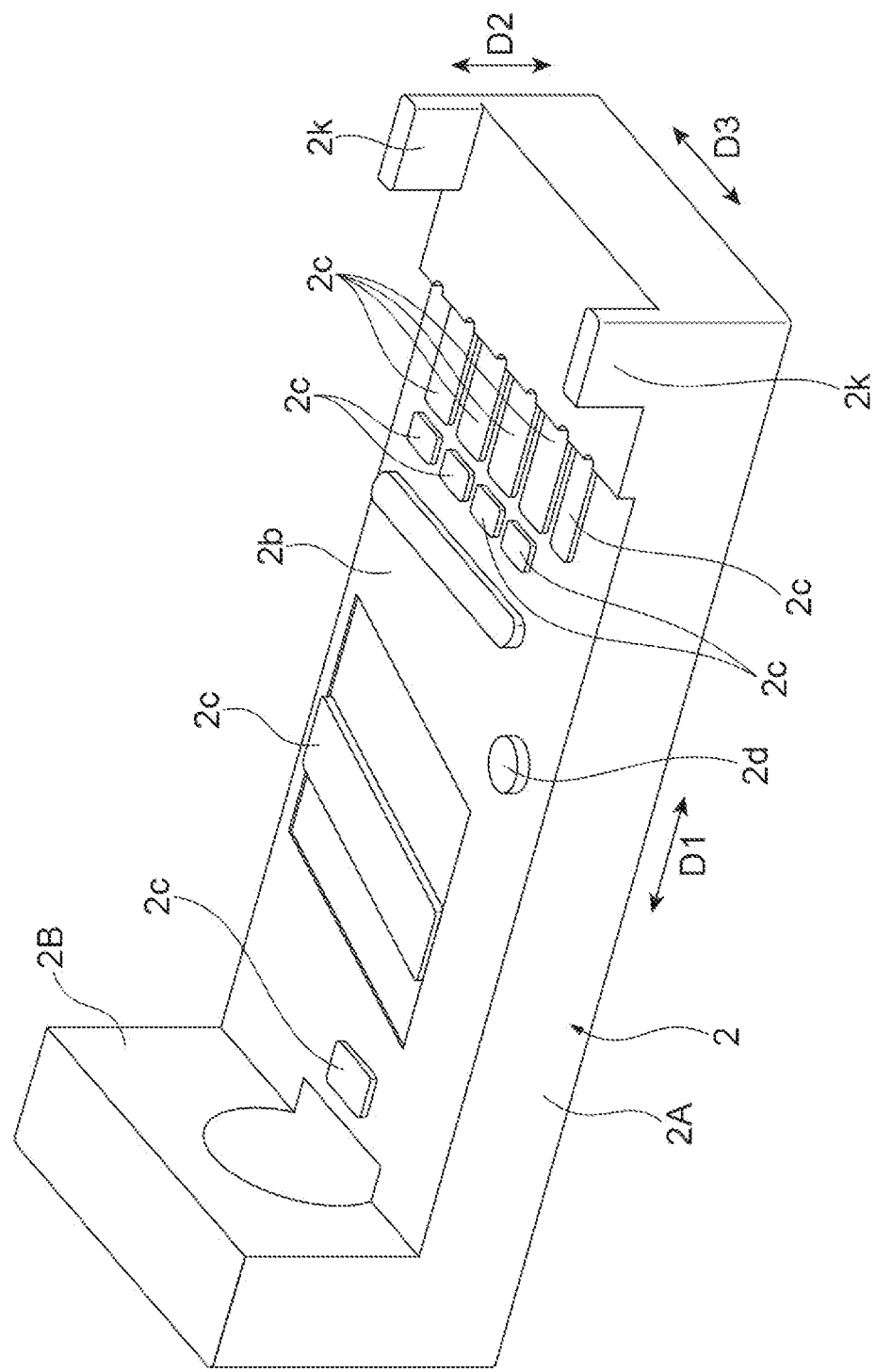
FIG. 5 is a perspective view illustrating a base of the optical device of FIG. 1.

FIG. 4 is a perspective view illustrating a configuration of the base 2 capable of suppressing the interference of the resin R with the output light L. FIG. 5 is a perspective view illustrating the base 2 of FIG. 4. As illustrated in FIGS. 4 and 5, the base 2 has a pair of protrusions 2k that protrude upward at the end portion opposite to the side wall 2B in the longitudinal direction D1. The pair of protrusions 2k are arranged to be aligned in the width direction D3. The first region 5A has a pair of recesses 5c aligned in the width direction D3. The wiring board 5 is fixed to the base 2 by fitting the protrusions 2k of the base 2 into the respective recesses 5c.

The base 2 has a convex mounting surface 2c on which components are mounted. The mounting surface 2c is an adhesive pedestal for the components. The mounting surface 2c is a surface on which each of the plurality of optical components of the optical device 1 is mounted. For example, the base 2 has the plurality of mounting surfaces 2c provided on the main surface 2b. Each of the plurality of mounting surfaces 2c mounts the optical component 6, the first lens 8, the second lens 11 and the carrier 12, respectively. The mounting surface 2c is a portion of the main surface 2b that protrudes in the height direction D2. Each mounting surface 2c is provided at a position higher than the main surface 2b. For example, the plurality of mounting surfaces 2c have the same height. In this case, when the plurality of mounting surfaces 2c are formed by polishing, a polishability can be improved, and a dimensional accuracy can be improved.

Figure 6:
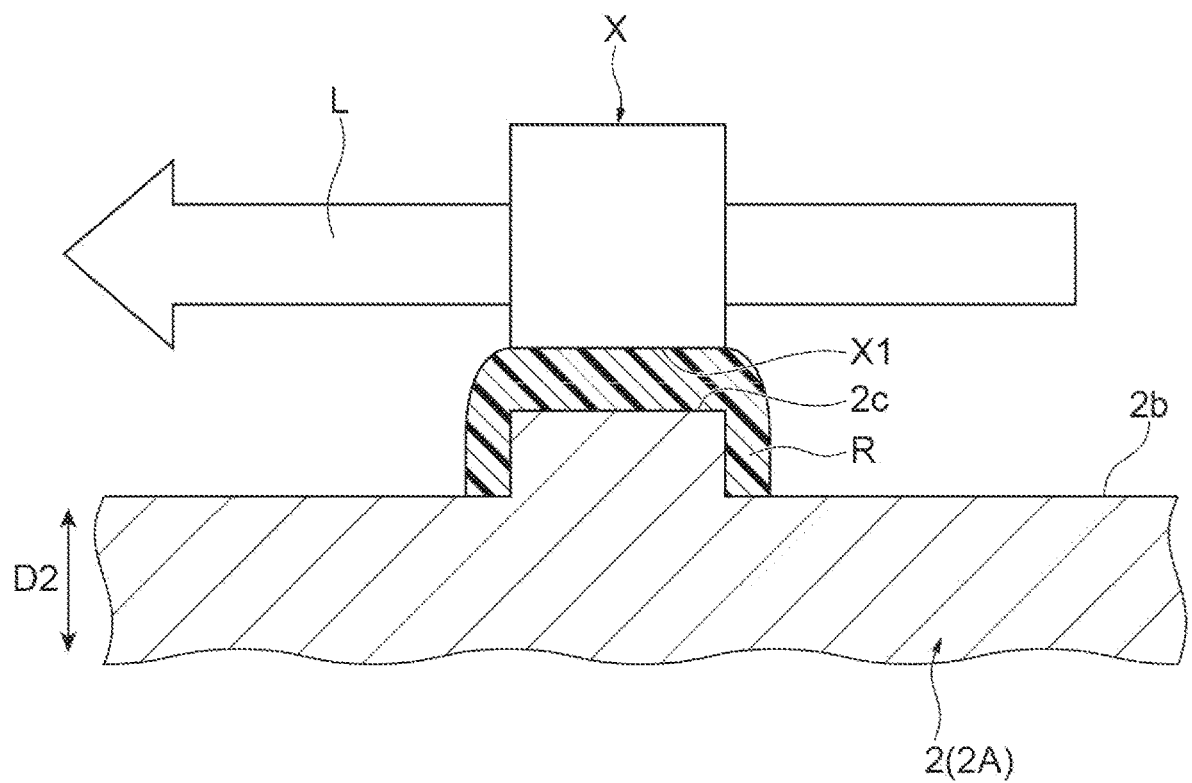
FIG. 6 is a view schematically illustrating a relationship between a base, an optical element, and an optical path of the optical device of FIG. 1.

FIG. 6 is a side view schematically illustrating the component X, the mounting surface 2c, and the resin R of the optical device 1. As illustrated in FIG. 6, when the component X is mounted on the mounting surface 2c via the resin R, even if the resin R protrudes from the component X, the protruding resin R flows under the mounting surface 2c. Accordingly, the interference of the resin R with the output light L can be avoided. For example, when the component X is viewed from the height direction D2, the mounting surface 2c is accommodated within the component X. The mounting surface 2c is accommodated within a surface X1 (for example, a lower surface) facing the base 2 of the component X. As a result, by causing the resin R to more reliably flow downward from the surface X1 of the component X mounted on the mounting surface 2c, the possibility that the resin R interferes with the output light L can be reduced.

Figure 7:
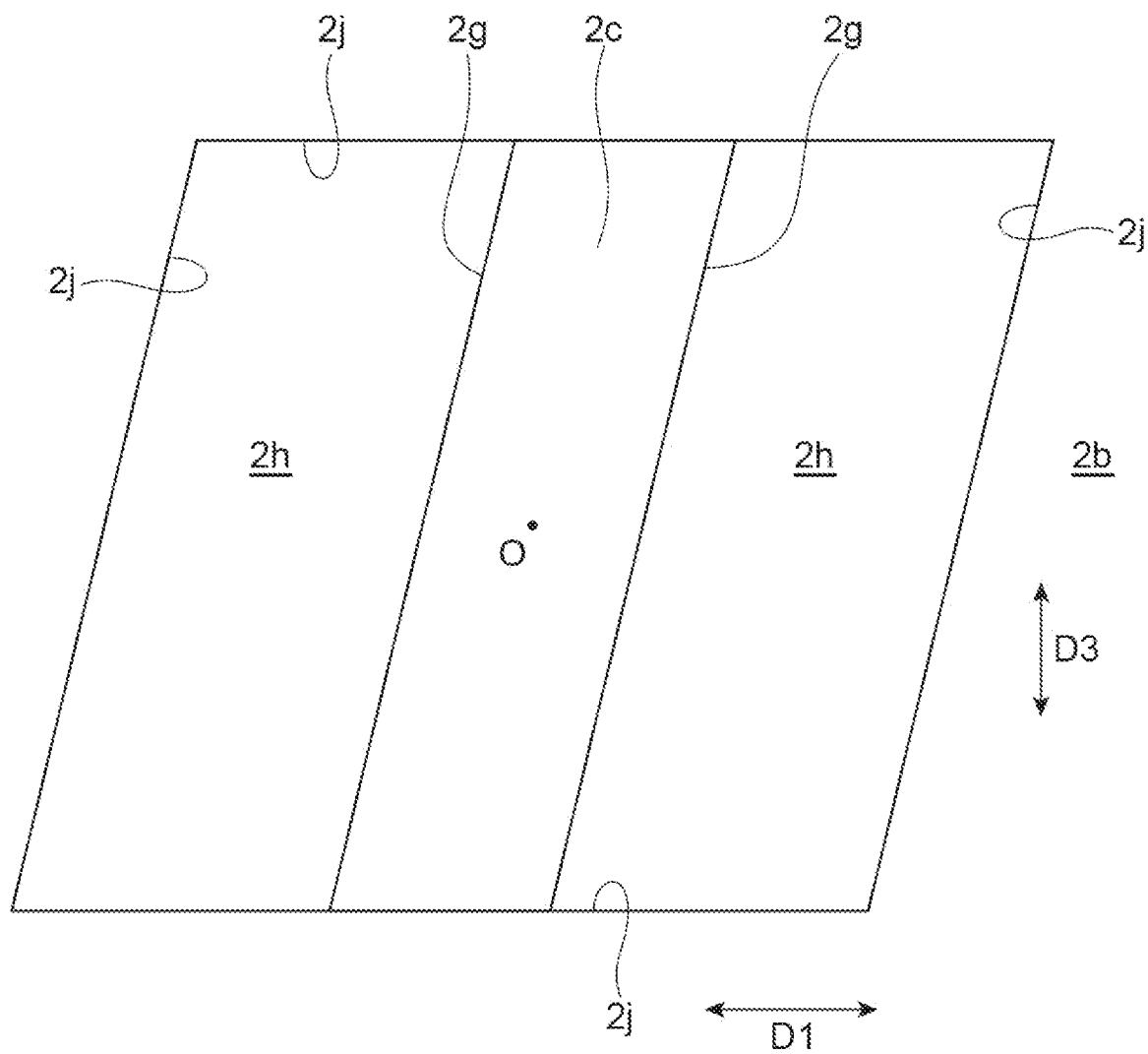
FIG. 7 is a plan view illustrating a mounting surface and grooves of the base in FIG. 5.

FIG. 7 is a plan view illustrating the mounting surface 2c of the exemplary optical component 6. As illustrated in FIGS. 4 and 7, the optical component 6 has two faces 6b extending parallel to each other, and the mounting surface 2c on which the optical component 6 is mounted has two sides 2g extending parallel to the two faces 6b. For example, the grooves 2h lower than the main surface 2b is formed around the mounting surface 2c. The grooves 2h are provided, for example, on one side and the other side of the mounting surface 2c in the longitudinal direction D1.

The grooves 2h has outer walls 2j along an outer shape of the optical component 6. The outer walls 2j is a wall portion constituting the outer shape of the mounting surface 2c and the grooves 2h as viewed from the height direction D2. For example, a distance from the mounting surface 2c to the outer walls 2j on the end side in the longitudinal direction D1 is constant regardless of a position in the width direction D3. That is, since the mounting surface 2c has the side 2g parallel to the surface 6b of the optical component 6, the above distance can be allowed to be constant. The mounting surface 2c and the outer walls 2j (optical component 6) have a point-symmetrical shape with respect to the center O as viewed from the height direction D2. As an example, the mounting surface 2c, the grooves 2h, and the outer walls 2j have a parallelogram shape. Since the mounting surface 2c is a parallelogram, a deviation of the position of each incident surface of the surface 6b (the height from the main surface 2b of the base 2) due to the tilt angle of the surface 6b of the optical component 6 can be allowed to be constant.

Figure 8:
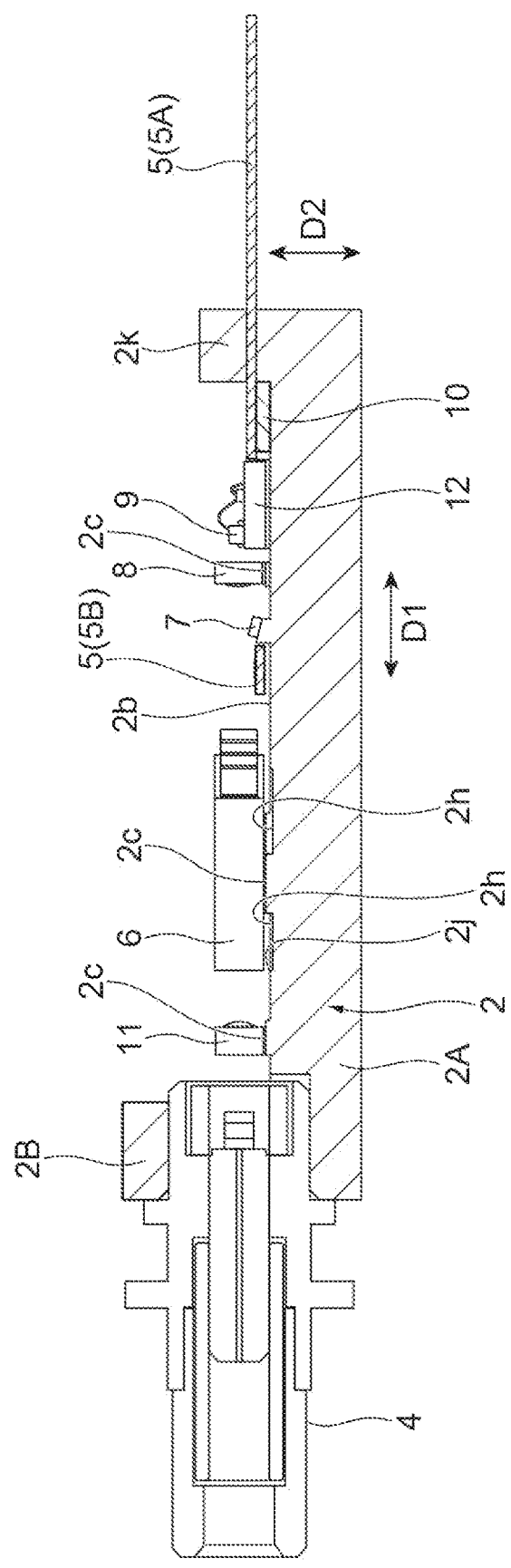
FIG. 8 is a side cross-sectional view illustrating a base, a lens, an optical component, a wiring board, and an optical element of the optical device of FIG. 1.
Figure 9:
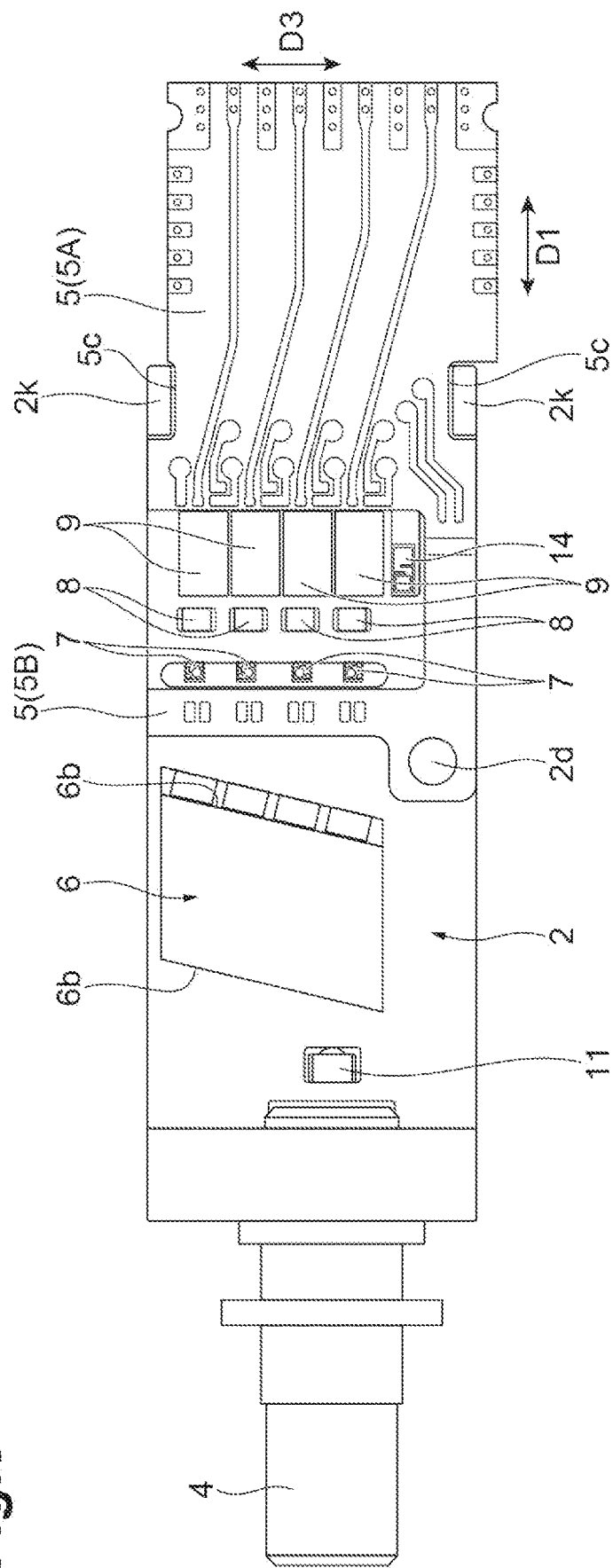
FIG. 9 is a plan view illustrating the base, the lens, the optical component, the wiring board, and the optical element in FIG. 8.

A manufacturing method for the optical device according to this embodiment will be described. An example of the manufacturing method for optical device 1 will be described below. First, the base 2 is prepared. Then, as illustrated in FIGS. 8 and 9, the positioning of the receptacle 4 and the base 2 is performed. It is noted that the receptacle 4 of which positioning is performed with respect to the base 2 is fixed to the base 2 by YAG welding. The wiring board 5, the carrier 12 on which the light-emitting element 9 is mounted, the light-receiving element 7, the thermistor 14, and the optical component 6 are mounted. At this time, the optical component 6 is mounted on the mounting surface 2c by using the outer walls 2j as an alignment marker (process of mounting the optical component). As described above, the outer walls 2j of the grooves 2h has the shape of the optical component 6, so that passive alignment can be performed.

Next, the first lens 8 and the second lens 11 are mounted on each mounting surface 2c of the base 2. Then, the output light L is output from the mounted light-emitting element 9, and the first lens 8 and the second lens 11 are respectively aligned (process of aligning the lenses). After aligning the first lens 8 and the second lens 11 so that the intensity of the output light L is maximized, the first lens 8 and the second lens 11 are fixed (active alignment), respectively.

Functions and effects obtained from the optical device 1 according to this embodiment and the manufacturing method for the optical device according to this embodiment will be described. In the optical device 1 and the manufacturing method for the optical device according to this embodiment, the base 2 has a lower plate 2A and side walls 2B, and the lower plate 2A has a plurality of mounting surfaces 2c. The light-emitting element 9 (carrier 12), the first lens 8, the second lens 11, and the optical component 6 are mounted on the plurality of mounting surfaces 2c, respectively.

In the lower plate 2A of the base 2, each of the plurality of mounting surfaces 2c has a convex shape. Accordingly, when each of the light-emitting element 9, the first lens 8, the second lens 11, and the optical component 6 with the resin R being applied under these components is mounted on the convex mounting surface 2c, even if the resin R protrudes, the protruding resin R flows downward from the mounting surface 2c. Accordingly, the resin R under the light-emitting element 9, the first lens 8, the second lens 11 and the optical component 6 can be prevented from rising up during the adhesion or the like. Accordingly, the interference of the resin R with the optical paths of the light-emitting element 9, the first lens 8, the second lens 11, and the optical component 6 can be suppressed. Furthermore, since the adhesive region of the resin R has a convex shape, the adhesive region of the resin R can be controlled. For example, when the external temperature changes, a deformation of the optical component 6 due to a difference in linear expansion coefficient can be suppressed.

The heights of the plurality of mounting surfaces 2c may be the same. In this case, when the plurality of convex mounting surfaces 2c are formed by polishing, since the heights of the plurality of mounting surfaces 2c are the same, a polishability can be improved. That is, the mounting surfaces 2c having the same height can be easily formed by polishing, and a dimensional accuracy of the mounting surfaces 2c can be improved. Furthermore, since the dimensional tolerance can be reduced, variations in optical coupling efficiency can be suppressed.

The optical component 6 may have two faces 6b extending parallel to each other, and the mounting surface 2c of the optical component 6 may have the two sides 2g extending parallel to the two faces 6b of the optical component 6. The distance between the two sides 2g of the mounting surface 2c of the optical component 6 may be smaller than the distance between the two faces 6b of the optical component 6. In this case, since the two faces 6b of the optical component 6 and the two sides 2g of the mounting surface 2c are arranged parallel to each other, a difference in tilt angle occurring in the optical component 6 can be eliminated.

Grooves 2h may be provided on both sides of the mounting surface 2c of the base 2 in the longitudinal direction D1 corresponding to the mounting surface 2c of the optical component 6. In this case, even if the amount of the resin R is large, the resin R can be released to the grooves 2h, so that the interference of the resin R with the optical path can be more reliably suppressed.

The grooves 2h may have the outer walls 2j along an outer shape of the optical component 6. In this case, the outer walls 2j of the grooves 2h can be used for passive alignment of the optical component 6.

In the manufacturing method for the optical device according to this embodiment, the light-emitting element 9, the first lens 8, the second lens 11, and the optical component 6 are mounted on each of the plurality of mounting surfaces 2c. Alignment of each of the first lens 8 and the second lens 11 can be performed by using the outer walls 2j of the grooves 2h of the base 2 as the alignment marker in a state where the components are mounted on the mounting surface 2c. Accordingly, the arrangement of the optical component 6, the first lens 8, and the second lens 11 on the mounting surface 2c can be performed with high accuracy.

The base 2 may be manufactured by MIM (Metal Powder Injection Molding). In this case, the cost for manufacturing the base 2 can be suppressed. In the base 2, since the side wall 2B to which the receptacle 4 is attached and the lower plate 2A to which the components are mounted are integrated, component tolerance cannot be easily generated, and the base 2 having a high rigidity can be formed. The base 2 has a pair of protrusions 2k protruding upward at the end opposite to the side wall 2B in the longitudinal direction D1. Accordingly, even if the component-mounted base 2 illustrated in FIG. 4 is erroneously arranged upside down, the side wall 2B and the protrusion 2k are in contact with the floor or the like, and thus, the interference of the mounted components with the floor or the like can be avoided.

Figure 10:
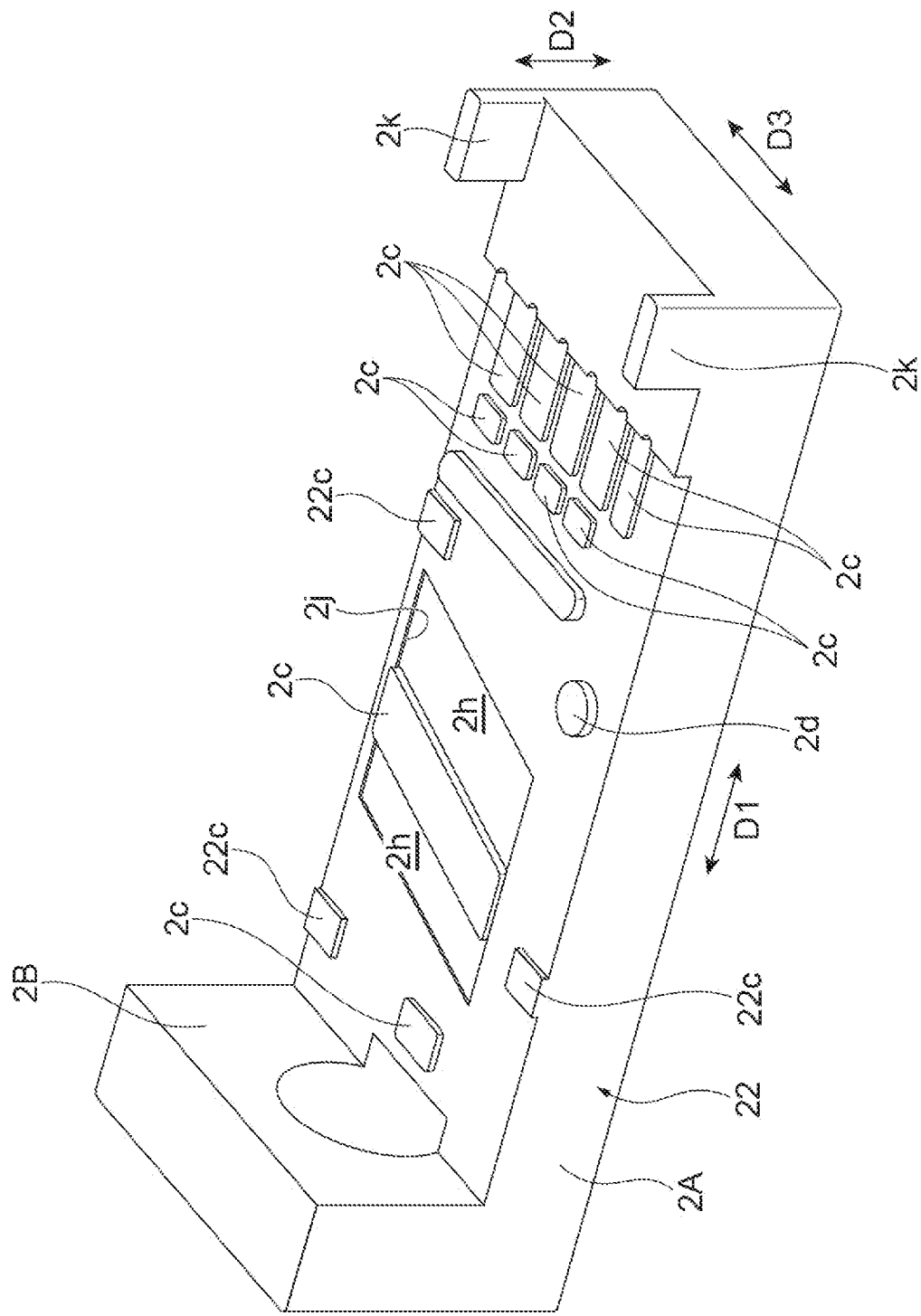
FIG. 10 is a perspective view illustrating a base according to a first modified example.

A base 22 according to the modification will be described with reference to FIG. 10. The base 22 includes a convex mounting surface 2c for mounting the component and a convex portion 22c for fixing the component mounting jig. The convex portion 22c and the mounting surface 2c are arranged, for example, to be aligned along the width direction D3. In this case, the position of the convex portion 22c in the longitudinal direction D1 is the same as the position of the mounting surface 2c in the longitudinal direction D1. For example, the height of the convex portion 22c is the same as the height of the mounting surface 2c.

Figure 11:
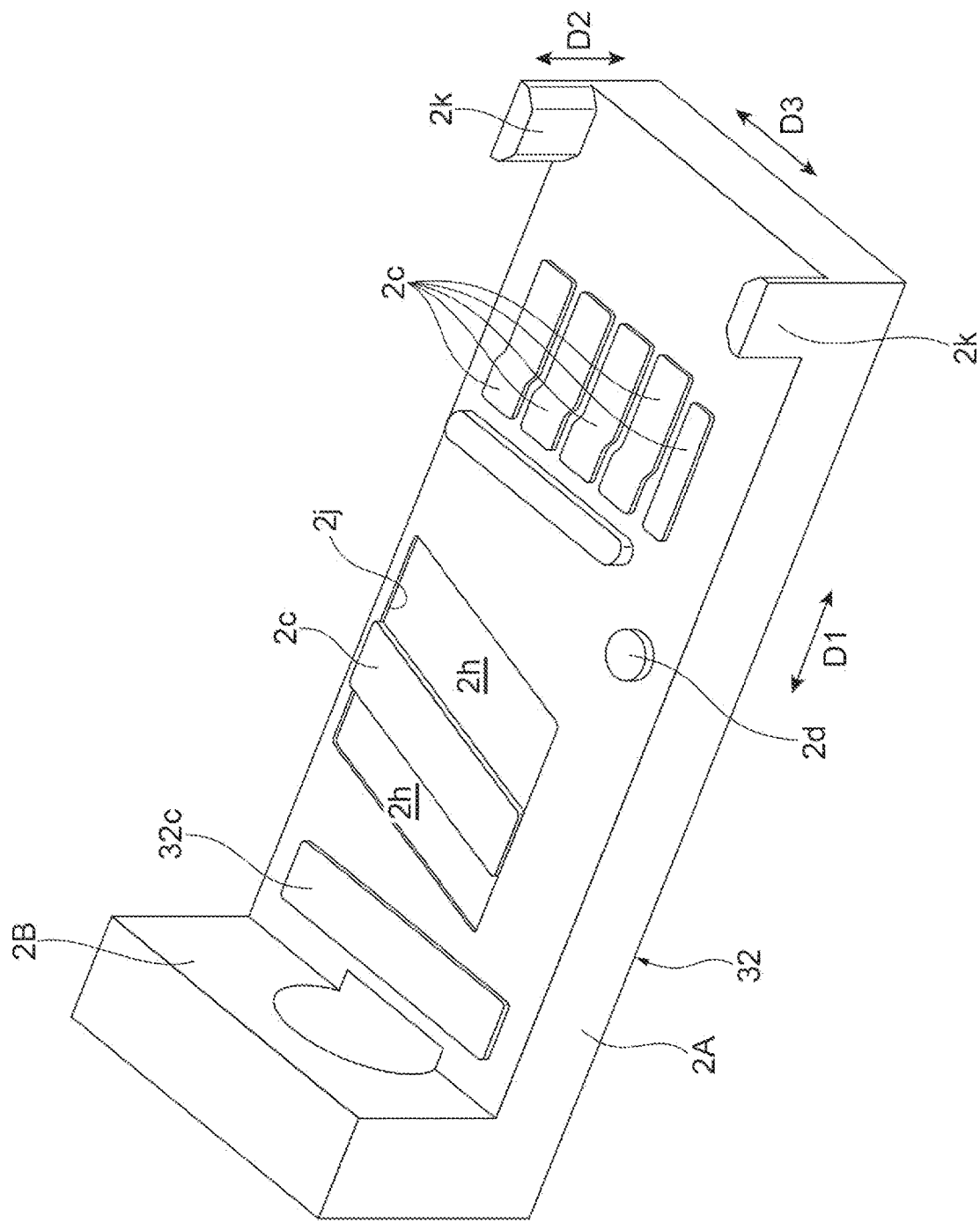
FIG. 11 is a perspective view illustrating a base according to a second modified example.

A base 32 according to another modified example will be described with reference to FIG. 11. Instead of the mounting surface 2c described above, the base 32 has a convex portion 32c having a planar shape longer in the width direction D3 than a planar shape (a shape viewed from the height direction D2) of the component (for example, the second lens 11). The convex portion 32c has a contact portion against which the component mounting jig is abutted when the component is mounted.

Figure 12:
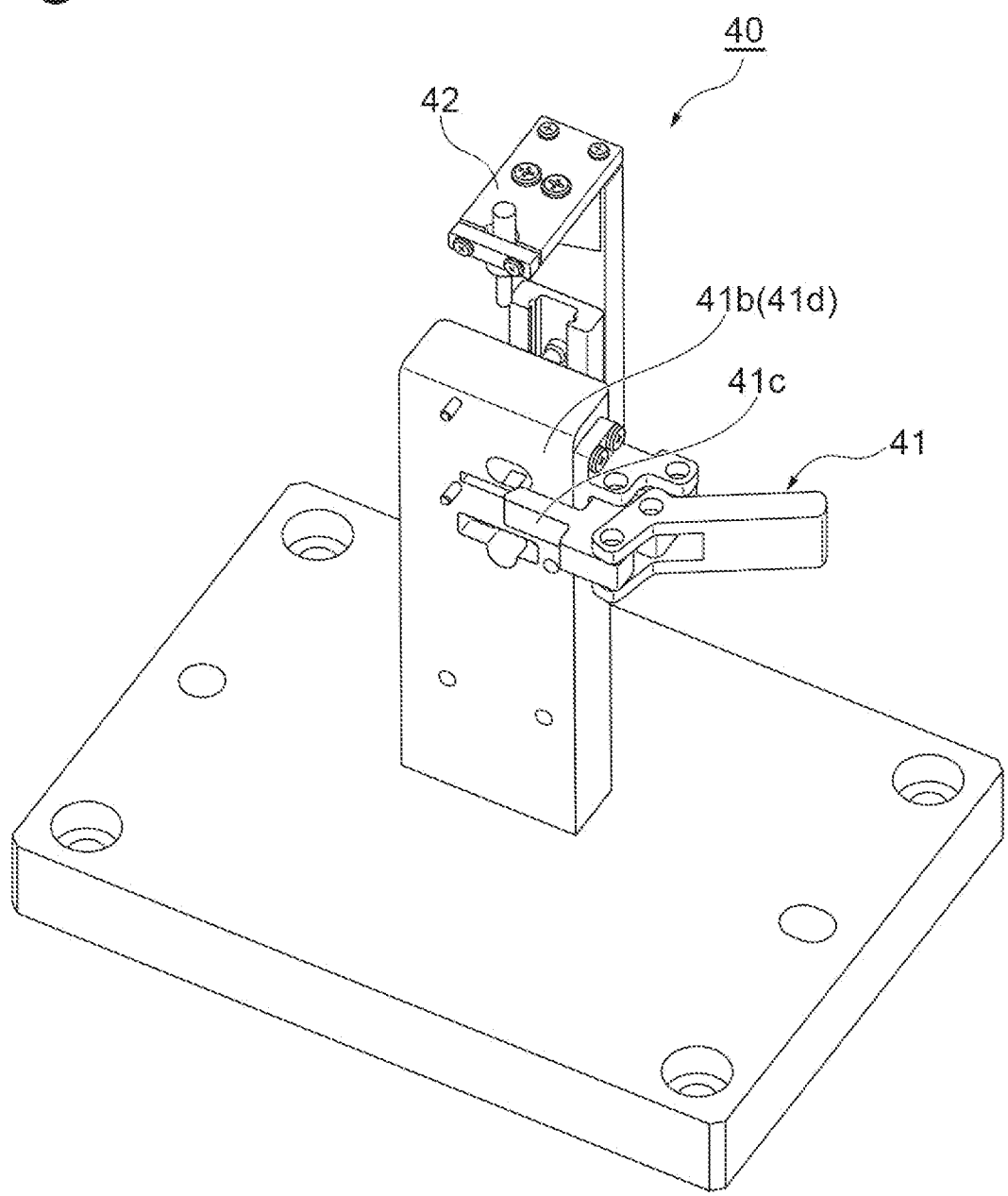
FIG. 12 is a perspective view illustrating a jig for mounting portions on a base.
Figure 13:
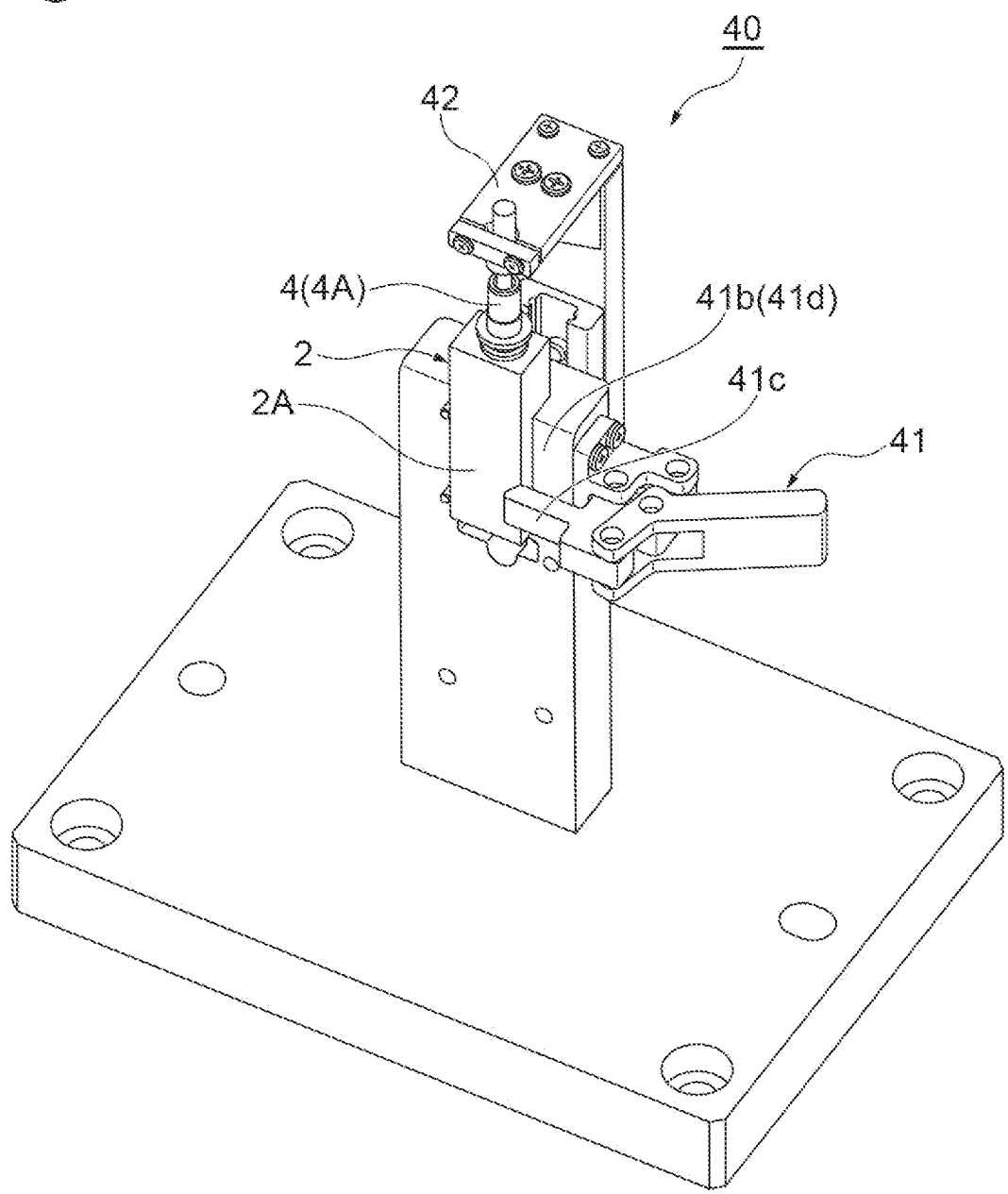
FIG. 13 is a perspective view illustrating a state of fixing a component to a base by using the jig of FIG. 12.

FIGS. 12 and 13 are perspective views illustrating the exemplary component mounting jig 40. The component mounting jig 40 is a jig for positioning a sleeve 4A of the receptacle 4 and the base 2. The component mounting jig 40 includes a base holding portion 41 that holds the base 2 and a sleeve holding portion 42 that holds the sleeve 4A. The base holding portion 41 has a facing portion 41b facing the main surface 2b side of the lower plate 2A of the base 2 and a holding portion 41c holding the base 2 in a state where the lower plate 2A faces the facing portion 41b.

In the base 22 having the convex portion 22c and the base 32 having the convex portion 32c, the positioning of the sleeve 4A with respect to the base 22 or the base 32 can be performed in a state where the convex portion 22c or the convex portion 32c is abutted against a contact surface 41d of the facing portion 41b. Accordingly, since the positioning of the sleeve 4A can be performed in a state where the base 22 or the base 32 is stabilized, the positioning accuracy of the sleeve 4A with respect to the components mounted on the base 22 or the base 32 can be improved. As a result, the alignment tolerance of the optical component can be increased, and the manufacturability can be improved. It is noted that the sleeve 4A of which positioning is performed with respect to the base 22 or base 32 is fixed to the base 22 or base 32 by YAG welding.

Heretofore, the embodiments of the optical device according to the present disclosure have been described above. However, the invention is not limited to the embodiments described above. That is, it will be readily recognized by those skilled in the art that the present invention can be modified and changed in various ways without departing from the scope of the claims. For example, the shape, size, number, material, and layout of each component of the optical device are not limited to those described above and can be changed as appropriate.

For example, in the above-described embodiments, the optical device 1 which is an optical transmitter is exemplified. However, the optical device according to the present disclosure may be an optical device other than the optical transmitter and may be an optical receiver. Further, in the above-described embodiments, the optical component 6, which is an optical multiplexer is exemplified. However, the optical component may be an optical component other than the optical multiplexer, and may be, for example, an optical demultiplexer that demultiplexes input lights. In this manner, the types of the optical device and the components mounted on the optical device can also be changed as appropriate.

REFERENCE SIGNS LIST

1: optical device, 2, 22, 32: base, 2A: lower plate, 2B: side wall, 2b: main surface, 2c: mounting surface, 2d: guide pin, 2f: outer surface, 2g: side, 2h: groove, 2j: outer wall, 2k: protrusion, 3: cover, 4: receptacle, 4A: sleeve, 4b: guide, 4c: flange, 5: wiring board, 5A: first region, 5b, 5d: pad, 5B: second region, 5C: connection region, 5c: recess, 5f: inclination, 6: optical component, 6b: face, 7: light-receiving element (optical element), 8: first lens (lens), 9: light-emitting element (optical element), 10: spacer, 11: second lens (lens), 12: carrier, 14: thermistor, 22c, 32c: convex portion, 40: component mounting jig, 41: base holding portion, 41b: facing portion, 41c: holding portion, 41d: contact surface, 42: sleeve holding portion, D1: longitudinal direction, D2: height direction, D3: width direction, L: output light, 0: center, R: resin (adhesive), X: component, X1: face.

The invention claimed is:

1. An optical device comprising:
   an optical element;
   a lens optically coupled with the optical element;
   an optical component provided between the optical element and the lens, optically coupling the optical element and the lens, and multiplexing or demultiplexing input lights, having a light input surface and a light output surface having an oblique face with respect to an optical axis of the input light, and the light input surface and the light output surface being parallel to each other;
   a base having a lower plate having a first convex mounting surface and a second convex mounting surface with the optical component being mounted on the first mounting surface and the second convex mounting surface, the first mounting surface and the second convex mounting surface having the same height and being parallel to a surface of the lower plate, and a side wall with a receptacle being connected thereto,
   wherein the mounting surface of the lower plate of the base has two parallel sides, and a distance between the two sides is smaller than a distance between the light input surface and the light output surface of the optical component, and
   wherein a relationship between the light input surface and the light output surface of the optical component is a relationship of being parallel to the two parallel sides of the mounting surface, and the optical component is arranged on the mounting surface in such a relationship that the two parallel sides of the mounting surface are located in respective inner sides from the light input surface and the light output surface of the optical component.

2. The optical device according to claim 1, wherein the optical component is a multiplexer multiplexing a plurality of the input lights.

3. The optical device according to claim 1, wherein the optical component is a demultiplexer demultiplexing the input light into a plurality of output lights.

4. The optical device according to claim 2,
   wherein the lower plate further has a convex light-receiving element mounting surface with a light-receiving element for receiving the input light being mounted on, and
   wherein the light-receiving element mounting surface is non-parallel to the surface of the lower plate and faces an opposite side of the side wall.

5. A manufacturing method for the optical device according to claim 1, comprising:
   a process of mounting the optical component on the mounting surface using the outer walls as the alignment marker; and
   a process of aligning the lens.

* * * * *